US006997107B2

(12) United States Patent
Abe et al.

(10) Patent No.: US 6,997,107 B2
(45) Date of Patent: Feb. 14, 2006

(54) PASTE CONTAINER FOR SCREEN PRINTING AND SCREEN PRINTING APPARATUS

(75) Inventors: Seiko Abe, Dazaifu (JP); Seiichi Miyahara, Kurume (JP); Yuji Otake, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/462,176

(22) Filed: Jun. 16, 2003

(65) Prior Publication Data

US 2003/0230203 A1    Dec. 18, 2003

(30) Foreign Application Priority Data

Jun. 18, 2002  (JP) ............................ P.2002-176849
Jun. 27, 2002  (JP) ............................ P.2002-187203
Aug. 30, 2002  (JP) ............................ P.2002-254313

(51) Int. Cl.
*B05C 17/04*    (2006.01)
(52) U.S. Cl. .................... 101/123; 101/366; 101/129; 118/406; 222/230
(58) Field of Classification Search .............. 101/123, 101/366, 129; 118/406, 213; 222/536, 330
See application file for complete search history.

(56) References Cited

U.S. PATENT DOCUMENTS

| | | | | |
|---|---|---|---|---|
| 4,023,486 A | * | 5/1977 | Linthicum et al. | 101/120 |
| 4,622,239 A | * | 11/1986 | Schoenthaler et al. | 427/96 |
| 4,693,209 A | * | 9/1987 | Leicht | 118/213 |
| 4,720,402 A | * | 1/1988 | Wojcik | 427/282 |
| 5,309,837 A | * | 5/1994 | Nanzai | 101/425 |
| 5,590,596 A | * | 1/1997 | Tani et al. | 101/123 |
| 5,806,423 A | * | 9/1998 | Tani | 101/123 |
| 5,947,022 A | * | 9/1999 | Freeman et al. | 101/123 |
| 6,158,338 A | | 12/2000 | MacRaild et al. | |
| 6,171,399 B1 | | 1/2001 | Kaiser et al. | |
| 6,495,199 B1 | | 12/2002 | Kaiser et al. | |
| 6,631,833 B2 | * | 10/2003 | Harriman et al. | 222/536 |

* cited by examiner

*Primary Examiner*—Andrew H. Hirshfeld
*Assistant Examiner*—Marissa Ferguson
(74) *Attorney, Agent, or Firm*—Pearne & Gordon LLP

(57) ABSTRACT

A cream solder cartridge used in a screen printing apparatus which prints cream solder on a board through pattern holes by sliding, on a mask plate, a closed squeegee that is stored with cream solder inside is composed of a long and narrow concave portion made of a flexible film-like material, a brim portion projecting from the outer periphery of the concave portion, and a film-like cover sheet that is stuck to the brim portion and thereby closes the opening of the concave portion. This configuration makes it possible to supply paste at a low cost and to perform a viscosity adjustment easily by externally stirring the paste accommodated inside.

5 Claims, 16 Drawing Sheets

PASTE CONTAINER FOR SCREEN PRINTING AND SCREEN PRINTING APPARATUS

BACKGROUND OF THE INVENTION

The present invention relates to a paste container that is used in screen printing in which paste such as cream solder or conductive paste is printed on a board.

In an electronic parts mounting process, screen printing is used as a method for printing paste such as cream solder or conductive paste on a board. In this method, a mask plate in which pattern holes are formed at printing locations is set on a board and paste is printed on the board via the pattern holes of the mask plate by squeegeeing.

Among squeegeeing methods for screen printing, a method for using a closed type squeegee head is known. In this method, unlike the conventional screen printing in which paste is directly supplied onto a mask plate, a squeegee head storing paste inside is used. More specifically, the paste inside the squeegee head is pressurized in a state that a paste contact surface that is provided in the bottom surface of the squeegee head is in contact with a mask plate, whereby paste is squeezed into pattern holes of the mask plate through the paste contact surface. The pattern holes are filled in order with paste by sliding the squeegee head on the mask plate.

However, the screen printing using the above conventional closed type squeegee head has the following problems. Unlike in the conventional printing method in which paste is directly supplied onto the mask plate, in the closed type squeegee head paste is placed in the squeegee head in such a manner that paste is housed in a dedicated container such as a cartridge. Therefore, if the paste has been used up during the course of a printing operation, new paste is supplied by replacing the old dedicated container with a new one.

However, the dedicated container for the above conventional closed type squeegee head requires a high running cost because it is formed by molding resin into a long and narrow box shape. Further, paste remains inside the container and is discarded without being used, which means a waste of resources. These problems are factors of increasing the cost of screen printing. Incidentally, in performing screen printing, a preparatory operation is necessary in which paste is stirred to adjust its viscosity. However, the paste that is housed inside the box-shaped dedicated container cannot be stirred externally by a simple method. This means a problem that the viscosity adjustment cannot be performed easily.

Furthermore, the above paste container made of a resin film also has the following problem. A resin material for making the paste container is inexpensive and can be handled easily during manufacture. A lid of the paste container is made of a resin film on which a sticking layer is formed in advance that is coated with an adhesive material or coated with a laminate member to improve the ease of work of opening the lid that was bonded to the container by thermo-compression bonding. Therefore, in a state that paste is contained inside the container, the sticking layer is in contact with the paste. A component of the sticking layer may be eluted by a solvent component in the paste to change the composition of the paste or deteriorate printing quality.

SUMMARY OF THE INVENTION

Therefore, an object of the present invention is to provide a paste container for screen printing that can supply paste at a low cost and facilitates a viscosity adjustment. Another object of the invention is to provide a paste container for screen printing that prevents deterioration in the composition of the paste.

According to the aspect of the present invention, a replaceable paste container for screen printing, held detachably in a container holding portion of a paste storage portion of a squeegee head, comprising a paste storage portion for storing paste inside, a pressurizing means for moving the paste downward from the paste storage portion by pressurizing the paste by a pressurizing plate, a printing space for containing paste moved from the paste storage portion and for bringing the paste into contact with a top surface of a mask plate via an opening that is formed at the bottom of the printing space, and two sliding contact portions opposed to each other to form front and rear walls in a squeegee direction of the printing space and to slide on the top surface of the mask plate wherein the replaceable paste container comprising a concave portion having long and narrow shape and made of a flexible film-like material, a brim portion projecting from an outer periphery of the concave portion perpendicularly to a depth direction of the concave portion, a film-like cover sheet member stuck to the brim portion for covering an opening of the concave portion, further wherein paste is contained in a space enclosed by the concave portion and the cover sheet member.

Furthermore the brim portion comprising a connecting means for connecting the paste container to the container holding portion in a state that the paste container is mounted on the container holding portion.

Furthermore the concave portion comprising a contact surface for contacting to a pressurizing plate of the squeegee head, a first planes connected to two respective side ends of the contact surface and extending downward, a second planes connected to the respective first planes, further wherein bending lines are formed between the first planes and the second planes so that the concave portion is bent inward.

Furthermore the cover sheet member comprising a sticking layer formed on one side of the cover sheet member for sticking the cover sheet to the brim portion, further wherein the paste container for screen printing comprising an isolation layer for isolating paste from the sticking layer by intervening between the paste and the sticking layer.

Furthermore a screen printing apparatus for printing paste on a board, using a squeegee head for screen printing, wherein the squeegee head comprising a paste storage portion for storing paste inside, pressurizing means for moving the paste downward from the paste storage portion by pressurizing the paste, a printing space for containing paste moved from the paste storage portion and for bringing the paste into contact with a top surface of a mask plate via an opening formed at the bottom of the printing space, and two sliding contact portions opposed to each other, to form front and rear walls in a squeegee direction of the printing space, and to slide on the top surface of the mask plate, further wherein the screen printing apparatus holds, detachably in a container holding portion of the paste storage portion, a replaceable paste container comprising a concave portion having long and narrow shape and made of a flexible film-like material, a brim portion projecting from an outer periphery of the concave portion perpendicularly to a depth direction of the concave portion, a film-like cover sheet member stuck to the brim portion for covering an opening of the concave portion, and a paste containing space enclosed by the concave portion and the cover sheet member for containing paste inside.

The configuration of the present invention makes it possible to supply paste at a low cost and to perform a viscosity adjustment easily by externally stirring the paste accommodated inside. Furthermore the configuration of the present invention realizes a paste container for screen printing that makes it possible to prevent elution of a component of the sticking layer into paste and hence deterioration of the composition of the paste.

DESCRIPTION OF THE PREFERRED EMBODIMENT

Figure 1:
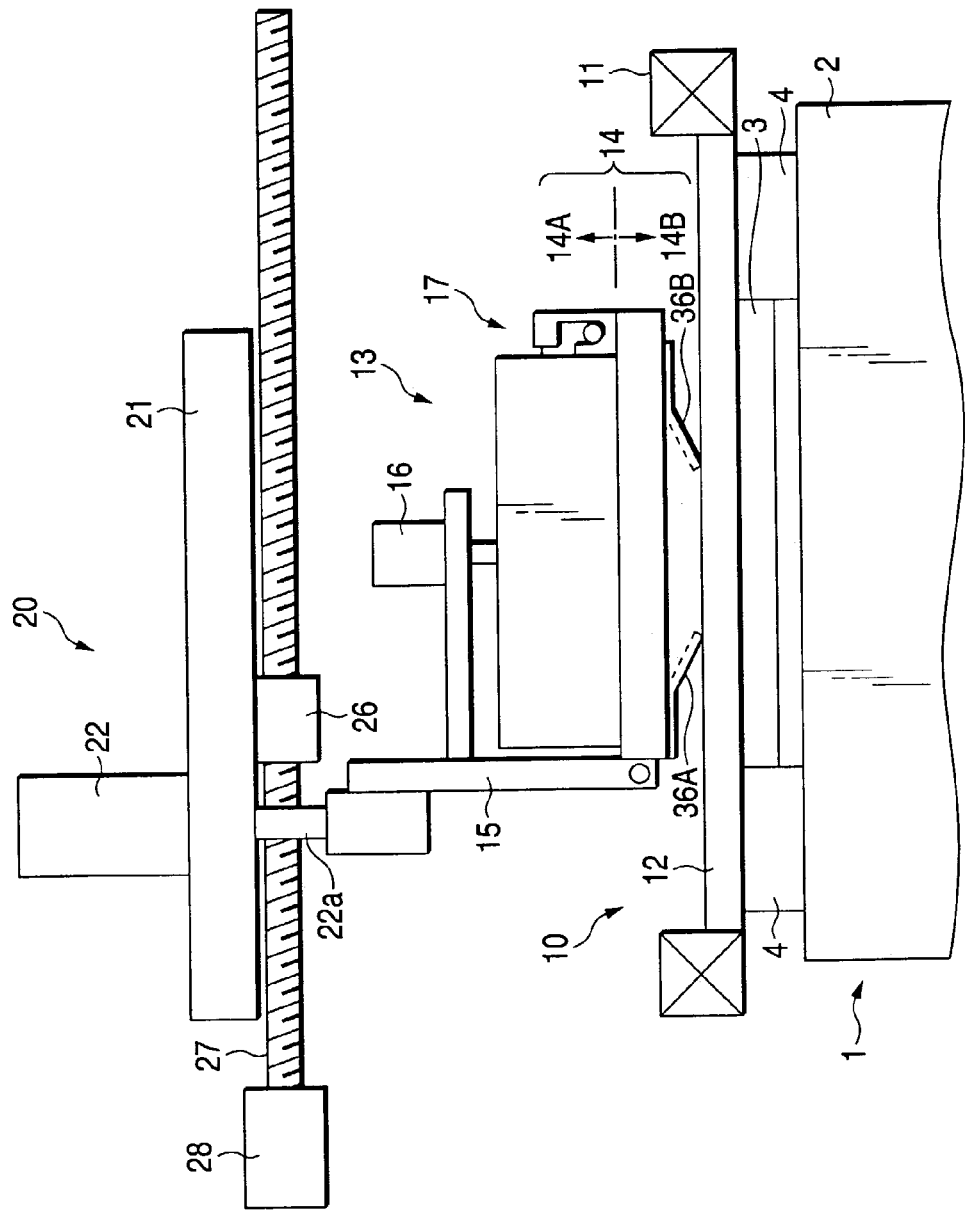
FIG. 1 is a front view of a screen printing apparatus according to one embodiment of the invention.
Figure 2:
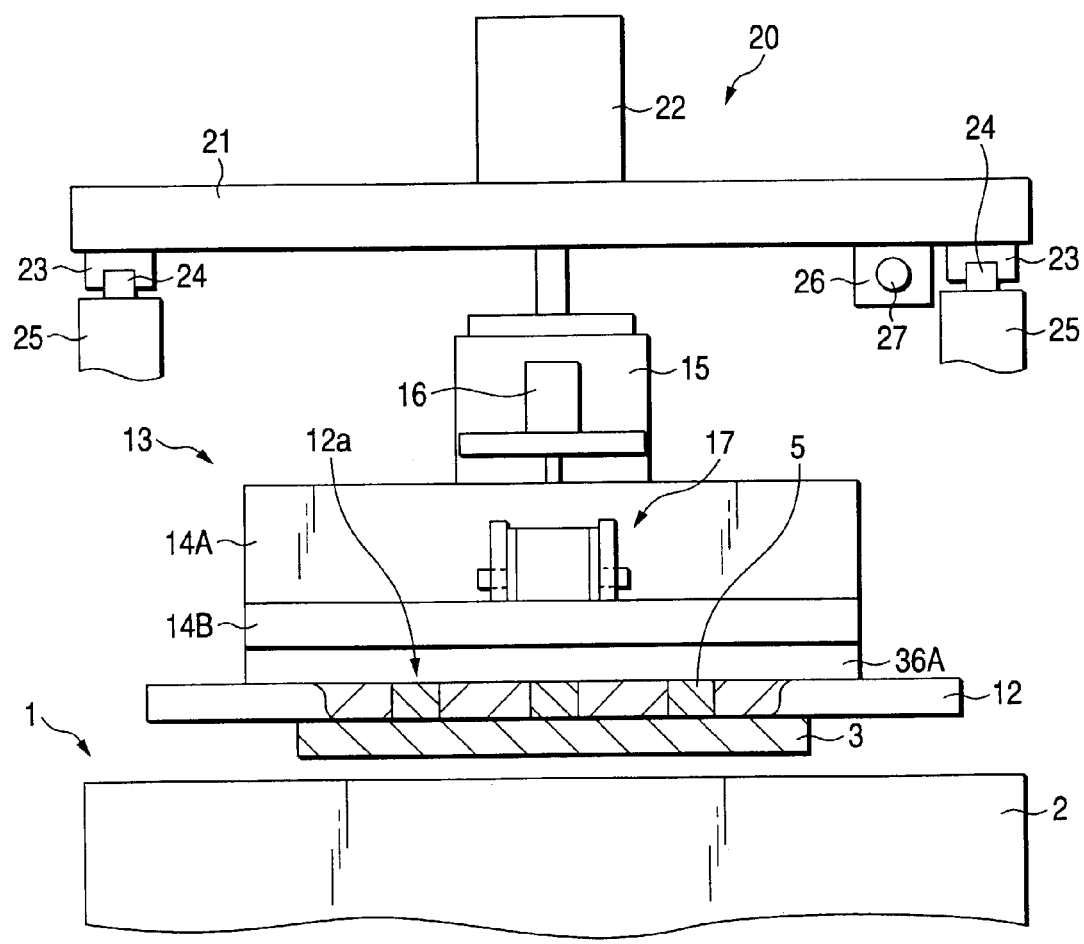
FIG. 2 is a side view of the screen printing apparatus according to the embodiment of the invention.

The structure of the screen printing apparatus will be described below with reference to FIGS. 1 and 2. In FIGS. 1 and 2, a board positioning section 1 is configured in such a manner that a board holding section 2 is disposed on a movable table (not shown). A board 3 as a subject of screen printing, which is held by a damper 4 of the board holding section 2, is positioned in the horizontal directions and the vertical direction by driving the movable table.

A screen mask 10 is disposed over the positioning section 1. The screen mask 10 is configured in such a manner that a mask plate 12 is attached to a holder 11. Pattern holes 12a are formed through the mask plate 12 at positions corresponding to printing locations of the subject board 3.

A squeegee head 13 is disposed over the screen mask 10 so as to be able to be elevated and lowered by a head elevation section 20. The head elevation section 20 is equipped with a cylinder 22 that erects from a plate member 21. The squeegee head 13 is connected to a bottom end portion of a rod 22a of the cylinder 22 via a connecting member 15. The squeegee head 13 is elevated and lowered with respect to the mask plate 12 by driving the cylinder 22. The head elevation section 20 is an elevating/lowering means for elevating and lowering the squeegee head 13 with respect to the screen mask 10.

Sliders 23 are fixed to the bottom surface of the plate member 21 of the head elevation section 20 at its two ends. Each slider 23 is slidably fitted with a guide rail 24 that is disposed on a frame 25. A nut 26 is connected to the bottom surface of the plate member 21, and a feed screw 27 that is threadedly engaged with the nut 26 is rotated by a motor 28.

The plate member 21 is moved in the horizontal direction by driving the motor 28, whereby the squeegee head 13 which is connected to the head elevation section 20 is also moved in the horizontal direction. The squeegee head 13 is moved in the horizontal direction on the mask plate 12 by driving the motor 28 in a state that the squeegee head 13 is lowered. That is, the motor 28, the feed screw 27, and the nut 26 constitute a moving means for moving the squeegee head 13 on the mask plate 12.

Figure 3:
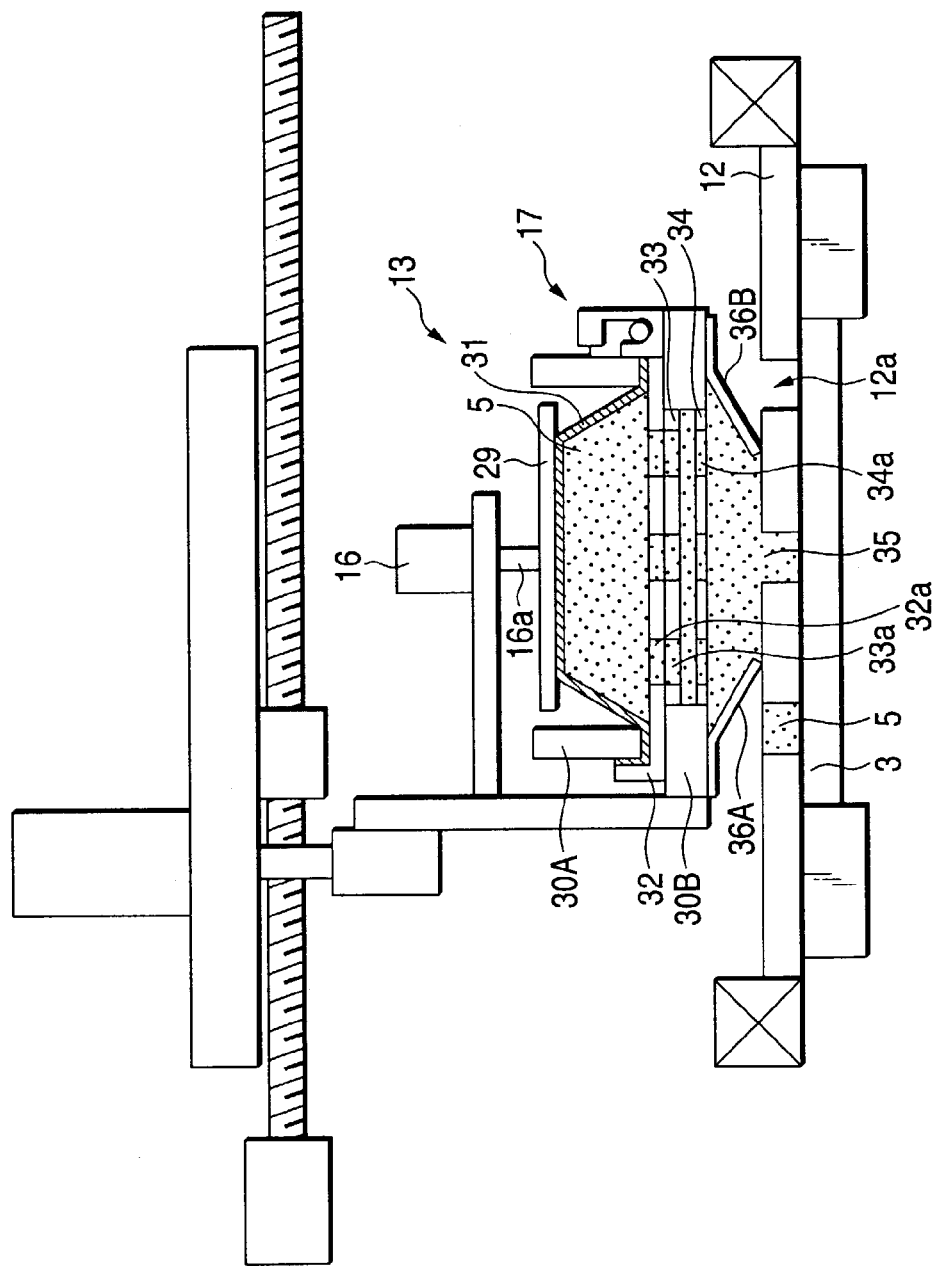
FIG. 3 is a partially sectional view showing a squeegee head of the screen printing apparatus according to the embodiment of the invention.
Figure 4:
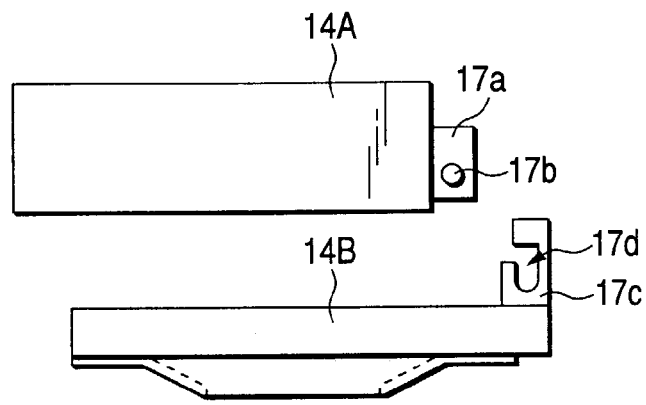
FIG. 4(a), FIG. 4(b) and FIG. 4(c) are side views of the squeegee head of the screen printing apparatus according to the embodiment of the invention.
Figure 4:
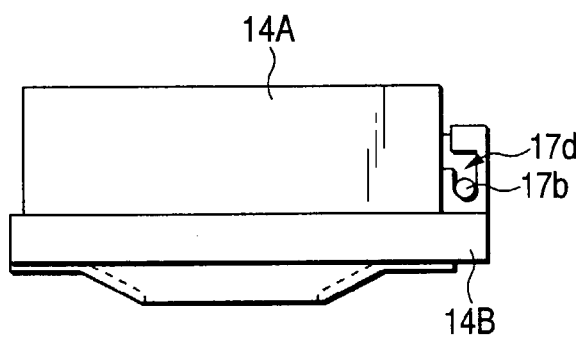
Figure 4:
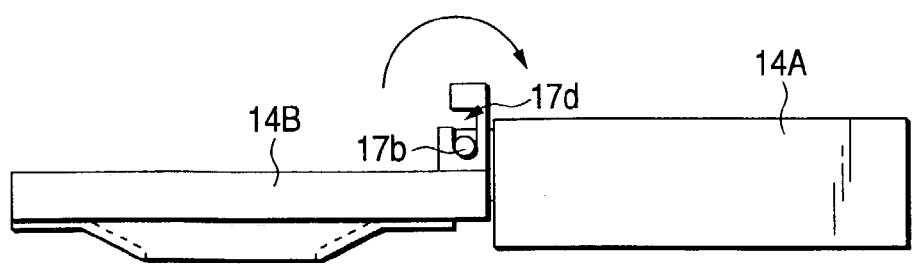

The squeegee head 13 is provided with a printing section 14 that fills the pattern holes 12a with cream solder 5 (i.e., paste) by touching the front surface of the mask plate 12. As shown in FIG. 1, the printing section 14 is divided into an upper portion 14A and a lower portion 14B. As shown in FIG. 3, the upper portion 14A and the lower portion 14B are equipped with a main body upper portion 30A and a main body lower portion 30B, respectively, that are long and narrow block-shaped members extending in the width direction of the mask plate 12.

As shown in FIG. 2, the length dimension of the main body upper portion 30A and the main body lower portion 30B is set so as to cover the width dimension of the board as the printing subject. The main body upper portion 30A and the main body lower portion 30B are connected to each other rotatably via hinges 17 (also refer to FIG. 5). The main body upper portion 30A and the main body lower portion 30B can be rendered in an open state by reversing the main body upper portion 30A with respect to the main body lower portion 30B.

Figure 5:
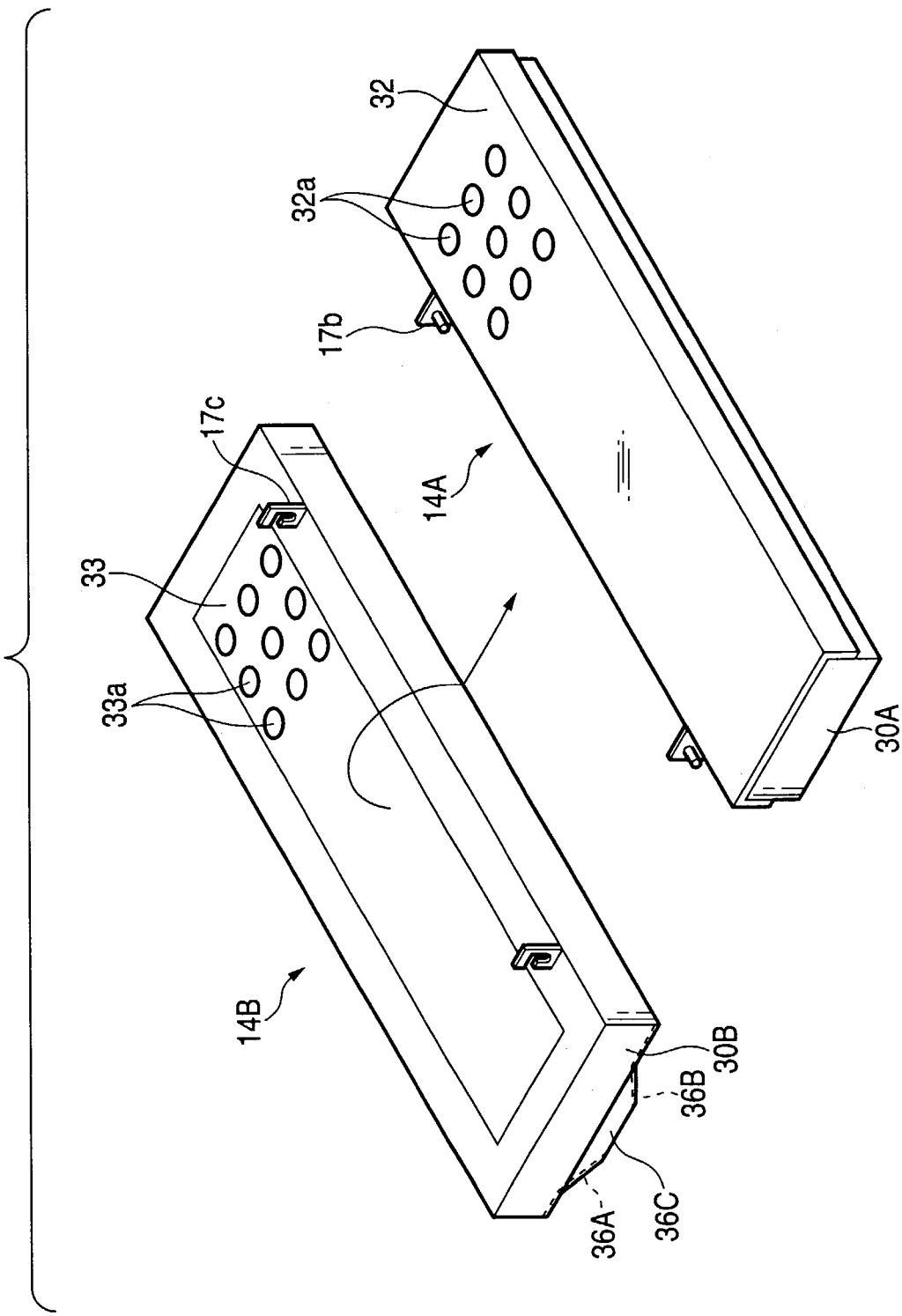
FIG. 5 is a perspective view of part of the squeegee head of the screen printing apparatus according to the embodiment of the invention.
Figure 6:
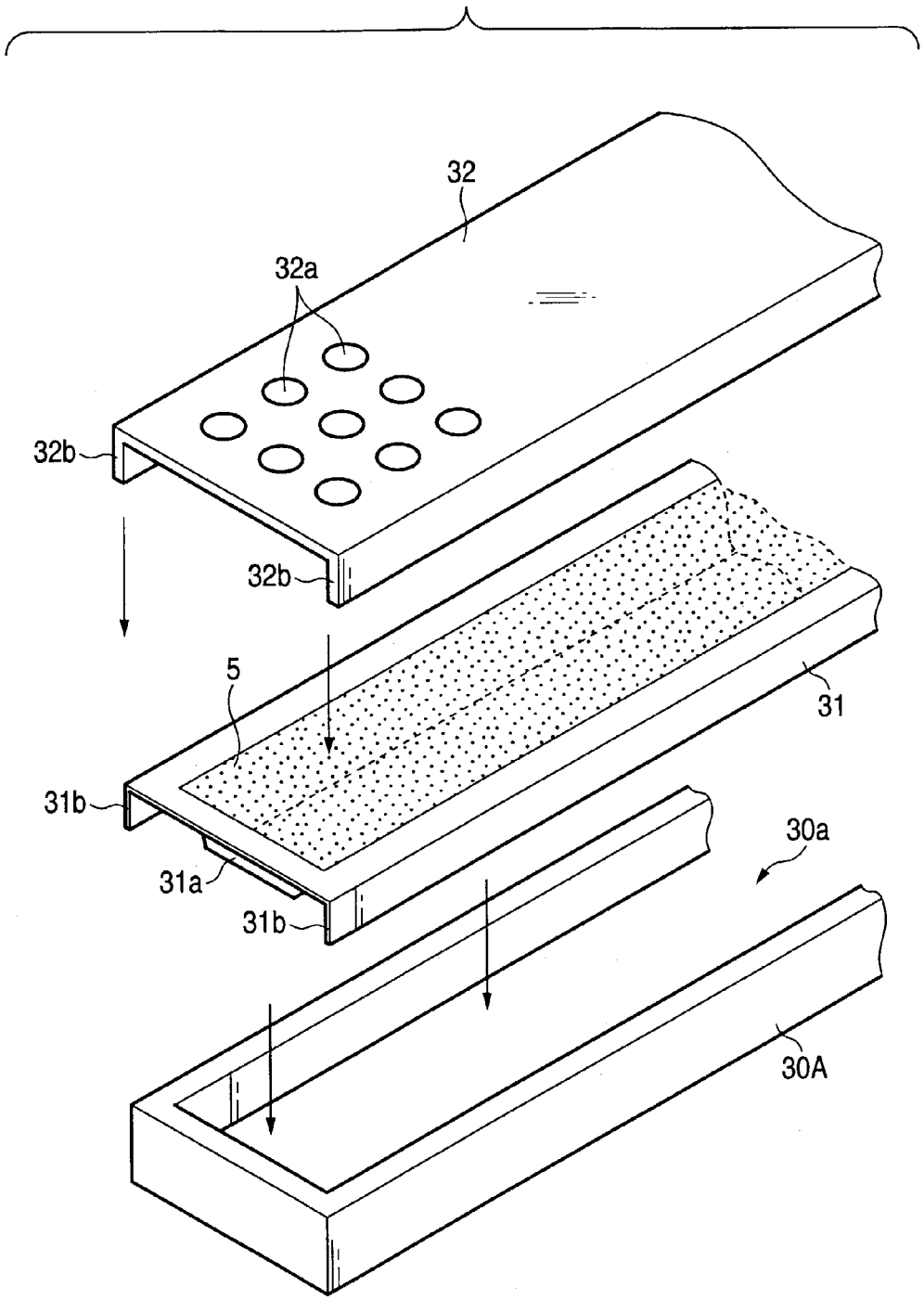
FIG. 6 is a perspective view showing part of a paste storage portion of the screen printing apparatus according to the embodiment of the invention.

As shown in FIGS. 3 and 6, the main body upper portion 30A is mainly a frame-shaped member having a recess 30a inside. A cartridge 31 that is stored with cream solder 5 is mounted replaceably in the recess 30a. The cartridge 31 is a replaceable container that is formed by shaping a flexible film-like material into a container shape and has a bottom opening in a mounted state. The cartridge 31 is attached to the main body upper portion 30A by means of a stopper plate 32 having a number of holes 32a (also refer to FIG. 5). The main body upper portion 30A and the cartridge 30 that is mounted in the recess 30a of the main body upper portion 30A constitute a paste storage portion of the squeegee head 13.

Figure 7:
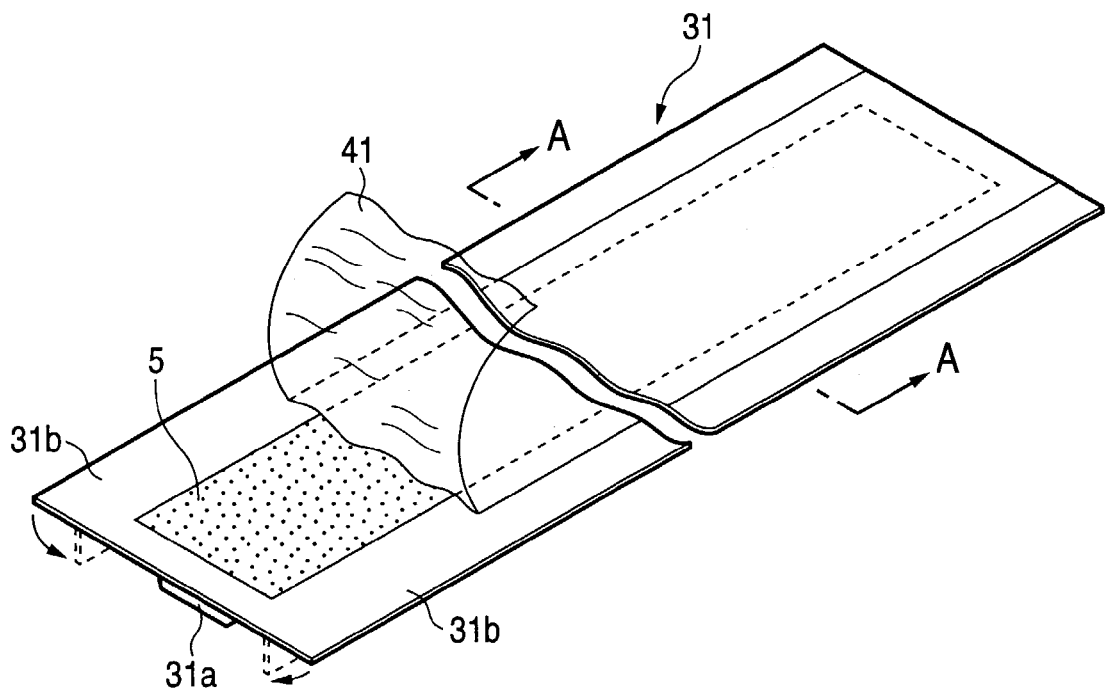
FIG. 7(a) illustrates the structure of a paste container of the screen printing apparatus according to the embodiment of the invention.
FIG. 7(b) is a cross sectional view of the paste container.
Figure 7:
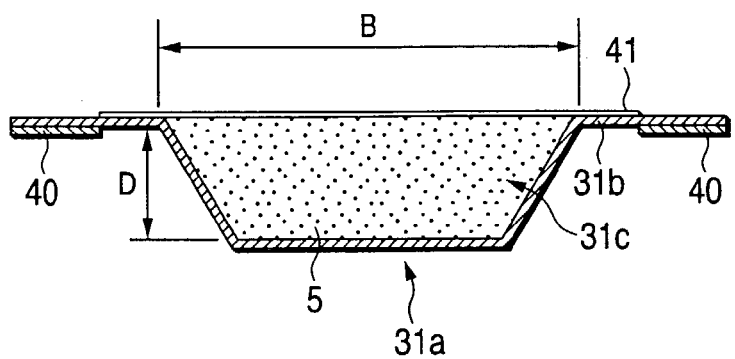

The structure of the cartridge 31 as a paste container will be described below with reference to FIG. 7(a) and FIG. 7(b). The cartridge 31 is formed by shaping a flexible film-like material such as a resin film, and is mainly a long and narrow concave portion 31a that conforms to the dimensions and shape of the recess 30a of the main body upper portion 10A as shown in FIG. 7(a). FIG. 7(b) shows a cross-section of the cartridge 31. The concave portion 31a has a flat-bottom shape in which the width B of the opening is greater than the depth D.

A brim portion 31b projects from the outer periphery of the concave portion 31a in the direction perpendicular to the depth direction of the concave portion 31a (i.e., in the horizontal direction in a mounted state). As described later, the brim portion 31b serves as holding planes when the cartridge 31 is mounted on the main body upper portion 30A. Adhesive sheets 40 each having an adhesive layer on both surfaces are stuck to the back surface of the brim portion 31b. The brim portion 31b is stuck and connected to the main body upper portion 30A with the adhesive sheets 40.

A cover sheet 41 that is a resin thin film is stuck to the entire front surface (i.e., the surface on the side opposite to recess side) of the brim portion 31b excluding bending margins that are bent when the cartridge 31 is mounted on the main body upper portion 30A. The opening of the concave portion 31a is closed by sticking the cover sheet 41 to the brim portion 31b, whereby a closed paste containing space 31c is formed between the concave portion 31a and the cover sheet 41.

Cream solder 5 is injected into the paste containing space 31c in a state that the cover sheet 41 is peeled off partially. The injected cream solder 5 is contained in the cartridge 31 in a closed state by sticking the cover sheet 41 to the brim 31b entirely. Another method for injecting cream solder 5 is to fill the paste containing space 31c with cream solder 5 using a pallet or the like and then stick the cover sheet 41 to the brim 31b entirely.

Next, the functions of the paste storage portion and a printing space of the squeegee head 13 will be described. As shown in FIG. 3, a pressurizing plate 29 for pressurizing the cream solder 5 is in contact with the top surface (in a mounted state) of the cartridge 31 that is mounted in the recess 30a. The pressurizing plate 29 is also in contact with a rod 16a of a cylinder 16 that is disposed above the pressurizing plate 29. The pressurizing plate 29 is pressed against the cartridge 31 from above by driving the cylinder 16. When the pressurizing plate 29 is pressed downward by the cylinder 16, the cartridge 31 made of a flexible film-like material is easily deformed, whereby the cream solder 5 inside the cartridge 31 is pressurized and pushed out downward through the holes 32a of the stopper plate 32. The cylinder 16 and the pressurizing plate 29 constitute a pressurizing means for pressurizing the cream solder 5.

A sticking preventive plate 33 is provided in the main body lower portion 30B so as to be in contact with the stopper plate 32. Circular holes 33a are formed through the sticking preventive plate 33 at positions corresponding to the holes of the stopper plate 32 (also refer to FIG. 5). The sticking preventive plate 33 prevents cream solder 5 as pushed out downward from the cartridge 31 from sticking to portions of the bottom surface of the stopper plate 32 other than the holes 32a.

An limiting plate 34 having a number of holes 34a like the sticking preventive plate 33 is attached to the main body lower portion 30B at its bottom. When cream solder 5 is pushed out by the cylinder 16, the cream solder passes through the three stages of hole arrangements, that is, the holes 32a of the stopper plate 32, the holes 33a of the sticking preventive plate 33, and the holes 34a of the limiting plate 34, as it is moved downward. The cream solder 5 thus pushed out reaches a space that is formed under the main body lower portion 30B, that is, a printing space 35 that is surrounded by two sliding contact portions 36A and 36B that are attached to the bottom surface of the main body lower portion 30B so as to be inclined inward and opposed to each other, the bottom surface of the main body lower portion 30B, and closing plates 36C (see FIG. 5) that are attached to two respective side end portions of the main body lower portion 30B.

The sliding contact portions 36A and 36B serve as front and rear walls, in the squeegeeing direction, of the printing space 35. In a state that the squeegee head 13 is lowered, the lower ends of the sliding contact portions 36A and 36B are in contact with the front surface of the mask plate 12. The printing space 35 stores the pressurized solder 5 and allows the cream solder 5 to touch the front surface of the mask plate 12 at the bottom opening (i.e., the opening between the sliding contact portions 36A and 36B). During a printing operation, the sliding contact portions 36A and 36B slide on the top surface of the mask plate 12 according to the motion of the squeegee head 13, whereby squeegeeing is performed in which the cream solder 5 inside the printing space 35 is raked.

When the cream solder 5 inside the cartridge 31 is pressurized by pushing down the pressurizing plate 29, the cream solder 5 passes the stopper plate 32, the sticking preventive plate 33, and the limiting plate 34 and reaches the printing space 35. The cross-section area of the pathway for the cream solder 5 is narrowed by a number of small holes 32a, 33a, and 34a. The viscosity of the cream solder 5 being pressurized is reduced when the cream solder 5 passes through these holes 32a, 33a, and 34a, whereby the properties of the cream solder 5 are changed so as to be suitable for screen printing.

Manipulations for combining, separating, opening, or closing the upper portion 14A and the lower portion 14B of the printing section 14 will be described below with reference to FIGS. 4(a), 4(b), 4(c) and 5. As described above, the squeegee head 13 is divided into the upper portion 14A including the cartridge 31 and the lower portion 14B including the printing space 35 and the upper portion 14A and the lower portion 14B are connected to each other with the hinges 17 so as to be able to be separated from each other and opened and closed.

As shown in FIG. 4(a), hinge plates 17a having respective pins 17b are fixed to one side surface of the upper portion 14A and hinge plates 17c having respective pin grooves 17d are fixed to the top surface of the lower portion 14B. Each hinge plate 17c has a cut at a top position, whereby the pin groove 17d has an opening there. To attach the upper portion 14A onto the lower portion 14B, as shown in FIG. 4(b) the pins 17b are fitted into the pin grooves 17d through the cuts of the hinge plates 17c. In this manner, the upper portion 14A can be mounted in place on the top surface of the lower portion 14B.

A state shown in FIG. 4(c) that the upper portion 14A is reversed and separated from the lower portion 14B is established by rotating the upper portion 14A with the pins 17b as supporting points from the state of FIG. 4(b). That is, the upper portion 14A can be opened or closed in a state that the upper portion 14A is pivotally supported by the lower portion 14B. As shown in FIG. 5, when opened, the upper portion 14A is held in a state that the stopper plate 32 mounted on the main body upper portion 30A is located above and hence the cartridge inside the recess 30a can be removed.

FIG. 6 is an exploded view of the upper portion 14A that is held in such a state. As described above, the main body upper portion 30A is a frame-shaped member having the recess 30a. The cartridge 31 is held detachably by the main body upper portion 30A in a state that the concave portion 31a is fitted in the recess 30a. The main body upper portion 30A is a container holding portion that detachably holds the cartridge 31 as the paste container.

In mounting the cartridge 31, end portions of the brim 31b are pressed against the outer side surfaces of the main body upper portion 30A by peripheral portions 32b that are formed by bending both side end portions of the stopper plate 32 downward. At this time, the end portions of the brim 31b are stuck to the main body upper portion 30A with the adhesive tapes 40 (see FIG. 7). The adhesive tapes 40 are connecting means for connecting the cartridge 31 to the main body upper portion 30A and allowing the former to be held by the latter.

Figure 8:
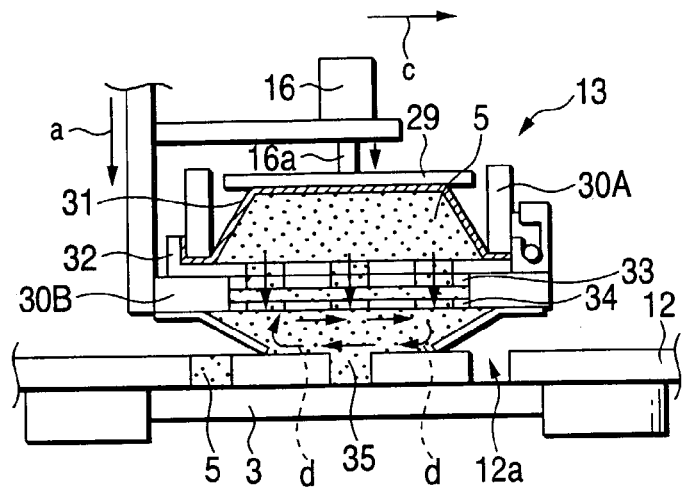
FIG. 8(a), FIG. 8(b) and FIG. 8(c) illustrate the operation of the screen printing apparatus according to the embodiment of the invention.
Figure 8:
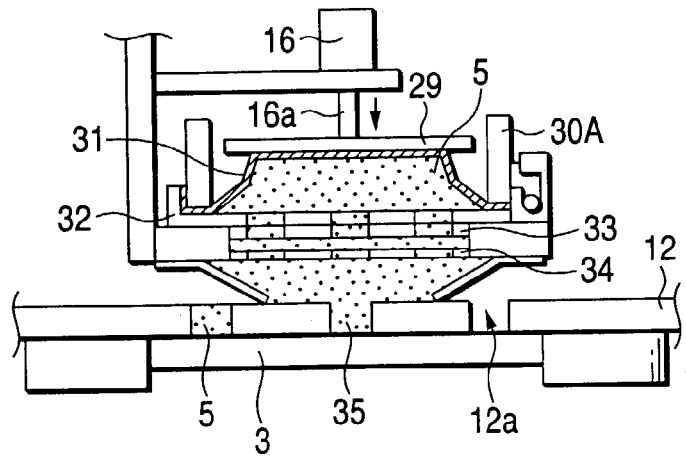
Figure 8:
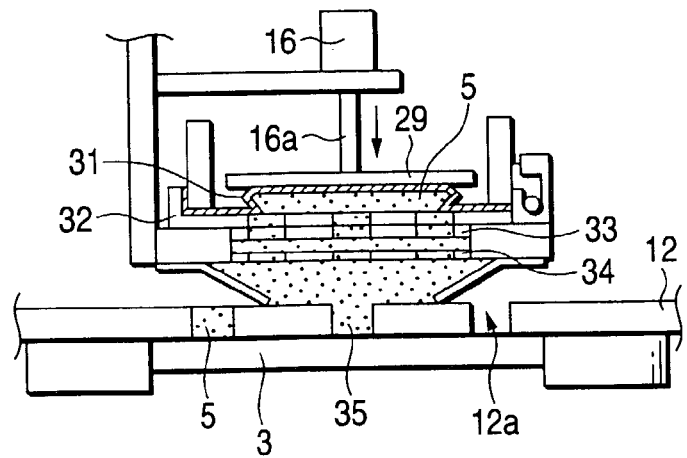

Next, a screen printing operation will be described with reference to FIGS. 8(a), 8(b), 8(c) and 8(d). To perform screen printing, as shown in FIG. 8(a), in a state that the main body upper portion 30A mounting the cartridge 31 and the stopper plate 32 is combined with the main body lower portion 30B, the squeegee head 13 is lowered toward the mask plate 12 (indicated by arrow a), whereby the sliding contact portions 36A and 36B are brought into contact with the mask plate 12. Then, in the main body upper portion 30A, the cartridge 31 is pressed by the cylinder 16 via the pressurizing plate 29. As a result, cream solder 5 is pushed out from the cartridge 31 and goes down into the printing space 35 (indicated by arrows b) through the holes 32a, 33a, and 34a (see FIG. 3).

Then, the squeegee head 13 in which the printing space 35 is filled with cream solder 5 is slid on the mask plate 12 (indicated by arrow c). As a result, a rolling flow of the cream solder 5 occurs in the printing space 35 (indicated by arrows d) as the cream solder 5 is raked with one of the sliding contact portions 36A and 36B, and cream solder 5 goes into pattern holes 12a of the mask plate 12 through the opening between the sliding contact portions 36A and 36B. As the squeegee head 13 is moved further, the pattern holes 12a are filled with cream solder 5 in order.

The cream solder 5 inside the printing space 35 and the cartridge 31 is consumed according to the above squeegeeing operation performed repeatedly. During that course, the concave portion 31a of the cartridge 31 is deformed being pressed by the pressurizing plate 29, whereby the cream solder 5 inside the cartridge 31 continues to be pushed out. Finally, as shown in FIG. 8(c), the concave portion 31a is almost crushed (its side walls are folded) and the cartridge 31 is rendered in a solder used-up state. The cartridge 31 will be replaced by a new one. Incidentally, by creasing the concave portion 31a in advance (see the structure of the cartridge shown in FIG. 7), the cream solder 5 can be pushed out smoothly.

Figure 9:
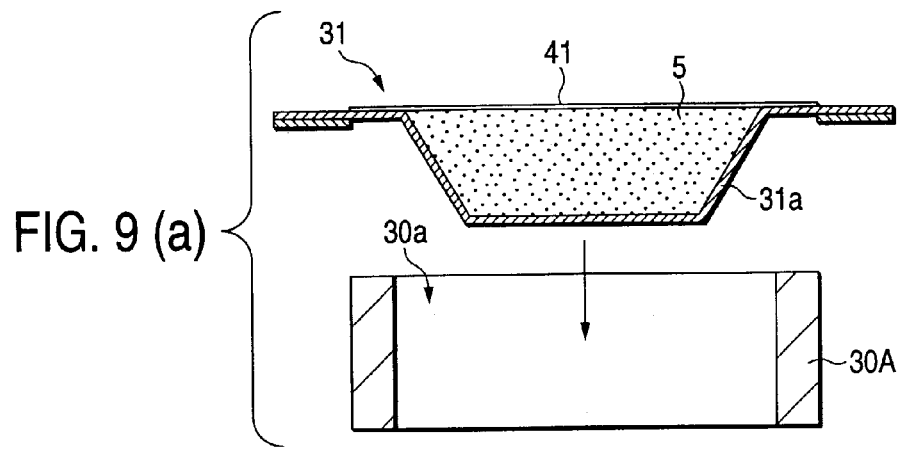
FIG. 9(a), FIG. 9(b), FIG. 9(c) and FIG. 9(d) illustrate a method for setting a paste container of the screen printing apparatus according to the embodiment of the invention.
Figure 9:
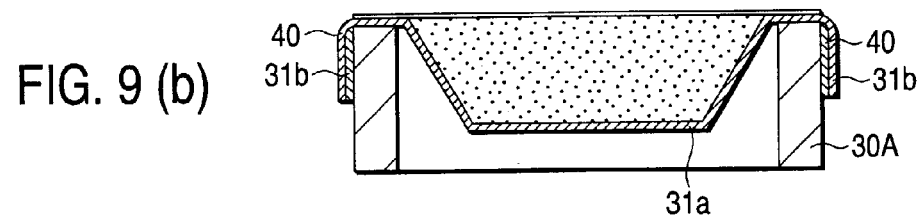
Figure 9:
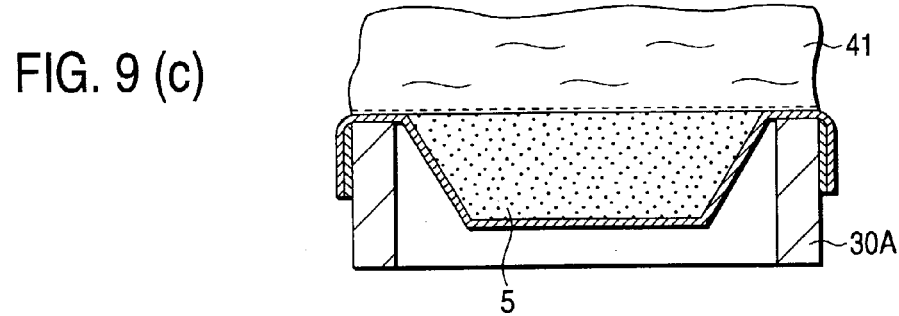
Figure 9:
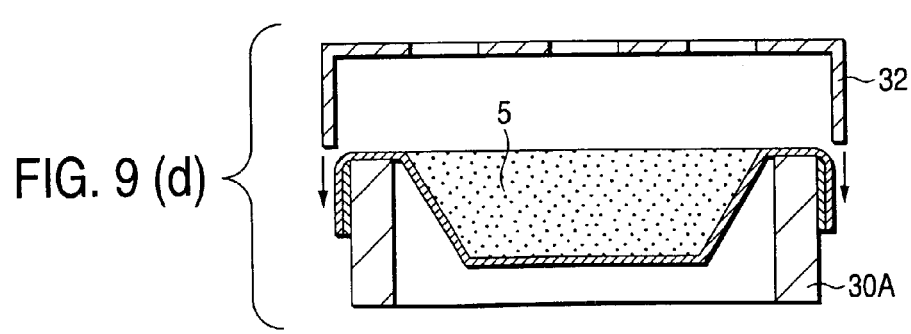

Next, a procedure for setting a new cartridge 31 will be described with reference to FIGS. 9(a), 9(b), 9(c) and 9(d). To set a new cartridge 31, the following operation is performed in a state that the main body upper portion 30A is reversed and detached from the main body lower portion 30B (see FIGS. 4 and 5). First, as shown in FIG. 9(a), a new cartridge 31 is mounted on the reversed main body upper portion 30A. This is done by fitting the concave portion 31a into the recess 30a and then bringing the brim 31b into contact with the top surface of the main body upper portion 30A. Then, as shown in FIG. 9(b), the end portions of the brim 31b are bent downward and the adhesive tapes 40 are stuck to the outer side surfaces of the main body upper portion 30A, whereby the cartridge 31 is connected to and held by the main body upper portion 30A.

Figure 10:
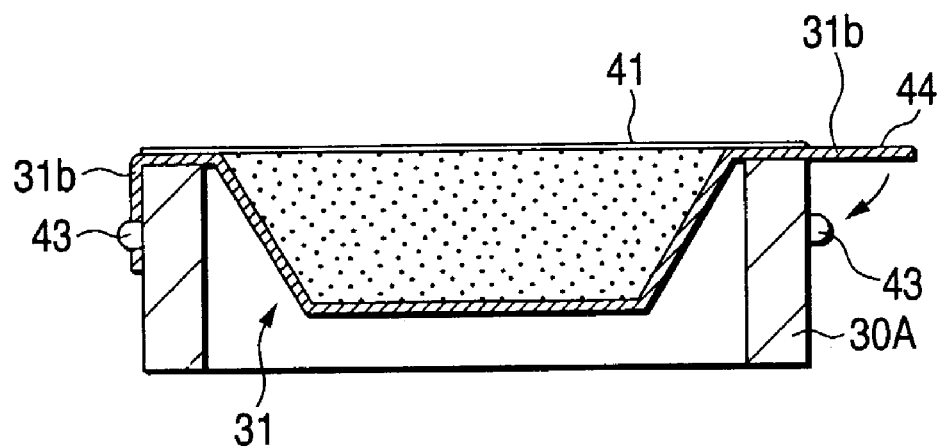
FIG. 10(a) and FIG. 10(b) are sectional views of other paste storage portions of the screen printing apparatus according to the embodiment of the invention.
Figure 10:
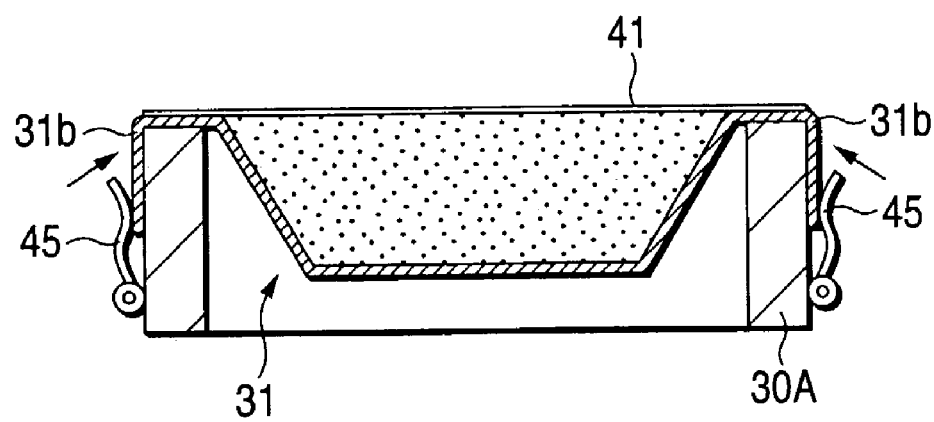

FIGS. 10(a) and 10(b) shows other versions of the connecting means for connecting the cartridge 31 to the main body upper portion 30A and allowing the former to be held by the latter. In the case of FIG. 10(a), the main body upper portion 30A is provided with locking pins 43. The locking pins 43 are fitted into locking holes 44 of the brim 31b of the cartridge 31, whereby the brim 31b is connected to and held by the main body upper portion 30A. In the case of FIG. 10(b), clamp springs 45 such as leaf springs are provided on the outer side surfaces of the main body upper portion 30A. The brim 31b is connected to and held by the main body upper portion 30A by pressing the end portions of the brim 31b against the outer side surfaces of the main body upper portion 30A by urging forces of the clamp springs 45.

Then, as shown in FIG. 9(c), the cover sheet 41 is peeled off the cartridge 31 that is connected to and held by the main body upper portion 30A, whereby the cream solder 5 that is accommodated inside the concave portion 31a is exposed. Then, as shown in FIG. 9(d), the stopper plate 32 is mounted on the main body upper portion 30A bearing the cartridge 31.

Subsequently, the main body upper portion 30A that is mounted with the cartridge 31 and the stopper plate 32 is reversed onto and combined with the main body lower portion 30B. Since the cartridge 31 is held by the main body upper portion 30A, a problem that the cartridge 31 deviates or comes off the main body upper portion 30A does not occur when the cartridge 31 is moved, reversed, or handled likewise.

Figure 11:
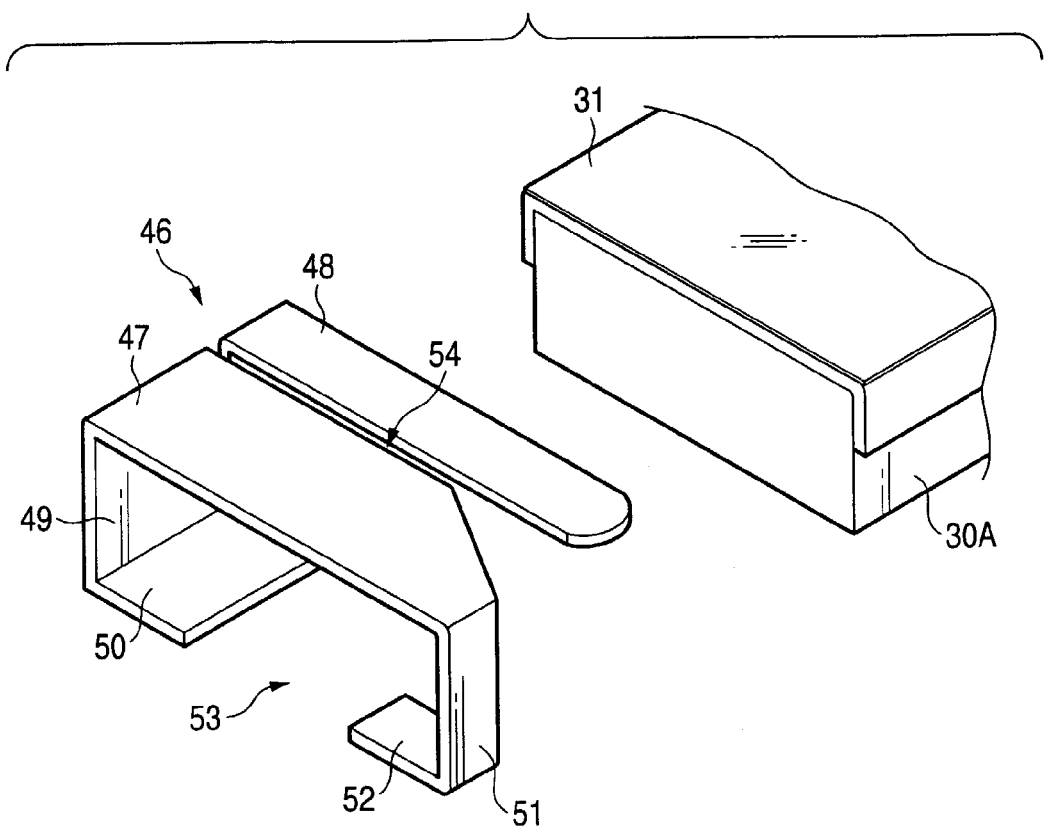
FIG. 11(a) and FIG. 11(b) show the structure of a cover sheet peeling jig for the paste container according to the embodiment of the invention.
Figure 11:
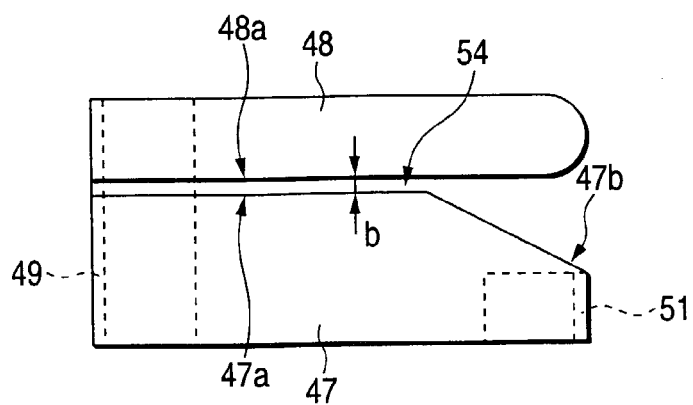

Next, the peeling of the cover sheet 41 shown in FIG. 9(c) will be described with reference to FIGS. 11(a), 11(b), 12(a) and 12(b). FIGS. 11(a) and 11(b) shows a cover sheet peeling jig 46 to be used for peeling the cover sheet 41 off the cartridge 31 that is held by the main body upper portion 30A. As shown in FIGS. 11(a) and 11(b), the cover sheet peeling jig 46 is formed by working, that is, bending, a metal sheet member so as to have a frame-like cross-section 53 that conforms to the vertical cross-section (rectangular shape) of the main body upper portion 30A so that the jig 46 can be attached slidably to the main body upper portion 30A that is mounted with the cartridge 31.

The frame-shaped cover sheet peeling jig 46 is composed of two top plates 47 and 48 that are separated from each other by a slit 54, a side plate 49 that is continuous with the top plates 47 and 48, a bottom plate 50 that is continuous with the side plate 49 and is bent inward, a side plate 51 that is opposed to the side plate 49 and is continuous with the top plate 47, and a bottom plate 52 that is continuous with the side plate 51 and is bent inward.

The width dimension b of the slit 54 is determined so as to be somewhat greater than the thickness dimension of the cover sheet 41 to be peeled off so that the cover sheet 41 can easily be drawn out through the slit 54 and that almost no gaps are formed between the drawn-out cover sheet 41 and the edges of the slit 54. A portion of the top plate 47 from which the cover sheet 41 is to enter the slit 54 is cut out to form a taper 47b, whereby the cover sheet 41 can easily be introduced into the slit 54.

A method for peeling off the cover sheet 41 using the cover sheet peeling jig 46 will be described below. First, as shown in FIGS. 9(a) and 9(b), the cartridge 31 is mounted on the main body upper portion 30A (a container mounting step). Then, end portions of the brim 31b are bent to cause the cartridge 31 to be connected to and held by the main body upper portion 30A (a connecting step).

Figure 12:
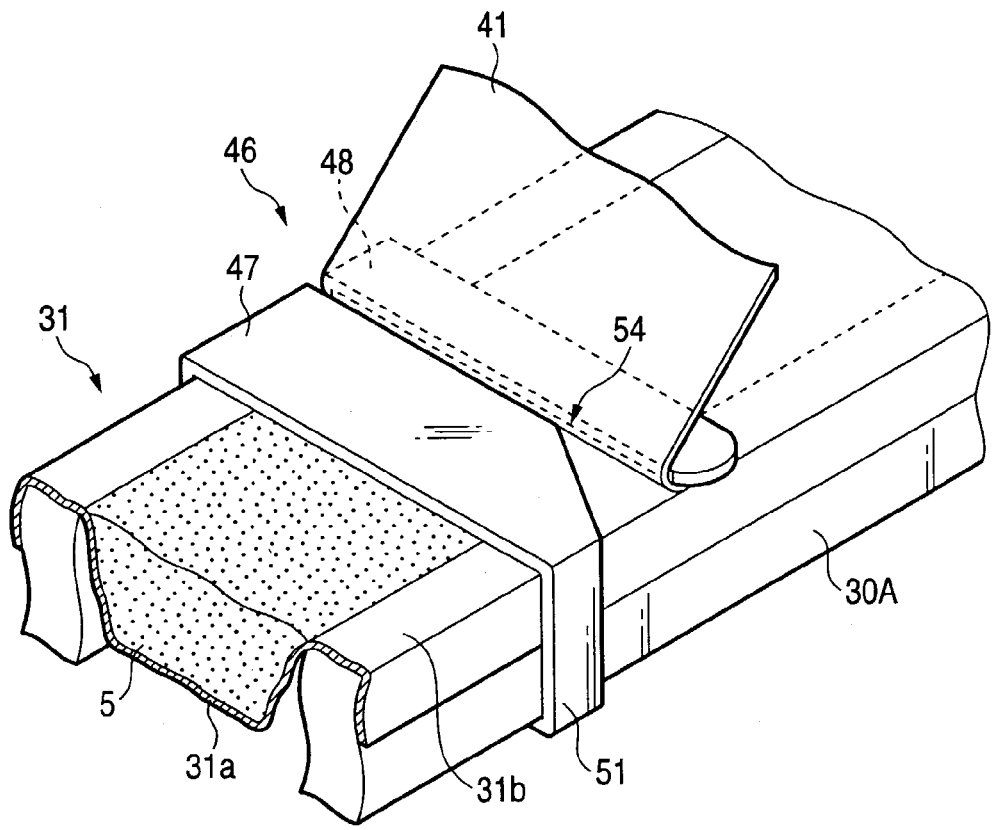
FIG. 12(a) and FIG. 12(b) illustrate a method for peeling off a cover sheet of the paste container according to the embodiment of the invention.
Figure 12:
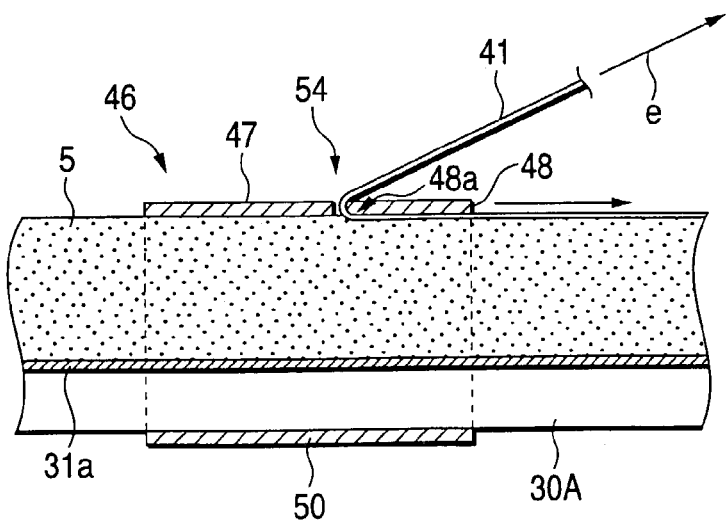

Subsequently, the cover sheet 41 is peeled off. As shown in FIG. 12(a), in a state that the cover sheet peeling jig 46 is attached to one end portion of the main body upper portion 30A to and by which the cartridge 31 is connected and held, the cover sheet 41 is peeled off slightly with fingers and drawn into the slit 54. Then, the cover sheet 41 is pulled from one end to the other end in the longitudinal direction of the cartridge 31, whereby the cover sheet 41 is peeled off the brim 31b. During that course, cream solder 5 that is stuck to the inner surface of the cover sheet 41 is scraped off into the concave portion 31a (a peeling step).

That is, when the cover sheet 41 is inserted into the slit 54 and pulled in the direction indicated by arrow e (i.e., in the longitudinal direction of the main body upper portion 30A), the outer surface of the cover sheet 41 touches an edge 48a of the top plate 48. As a result, the top plate 48 is moved together with the cover sheet 41, that is, the entire cover sheet peeling jig 46 is slid in the sheet peeling direction. In this manner, the cover sheet 41 is peeled off the brim 31b. As the cover sheet 41 is peeled off, an edge 47a of the top plate 47 moves following the cover sheet 41 while touching the inner surface of the cover sheet 41, whereby cream solder 5 that is stuck to the inner surface of the cover sheet 41 is scraped off by the edge 47a into the concave portion 31a.

In the above cover sheet peeling jig 46, the top plates 47 and 48, the side plates 49 and 51, and the bottom plates 50 and 52 constitute a slide portion that is attached to the main body upper portion 30A so as to be slidable in the longitudinal direction in a cover sheet peeling operation. The top plates 47 and 48 are plate-shaped planar portions provided in the slide portion so as to be movable parallel with the brim 31b. The top plates 47 and 48 have the slit 54 that is formed in accordance with the width dimension and the thickness dimension of the cover sheet 41. During a peeling operation, the front edge (i.e., edge 48a) of the slit 54 touches the outer surface of the cover sheet 41 during a peeling operation and the rear edge (i.e., edge 47a) of the slit 54 touches the inner surface of the cover sheet 41. By using the cover sheet peeling jig 46 having the above shape and structure in peeling off the cover sheet 41, a cover sheet peeling operation that should be performed with the greatest care becomes easy, and a waste of resources by peeling off the cover sheet 41 with cream solder 5, which is very viscous and hence sticky, stuck to the inner surface of the cover sheet 41 is prevented. A cover sheet peeling jig having another structure is possible in which the top plates 47 and 48 are connected to each other with a hinge at one end of the slit 54 so that the top plate 48 can be opened and closed with respect to the top plate 47 in the horizontal plane. This allows the slit 54 to be made very wide when necessary, and hence facilitates a manipulation of inserting the cover sheet 41 into the slit 54 in setting the jig.

Figure 13:
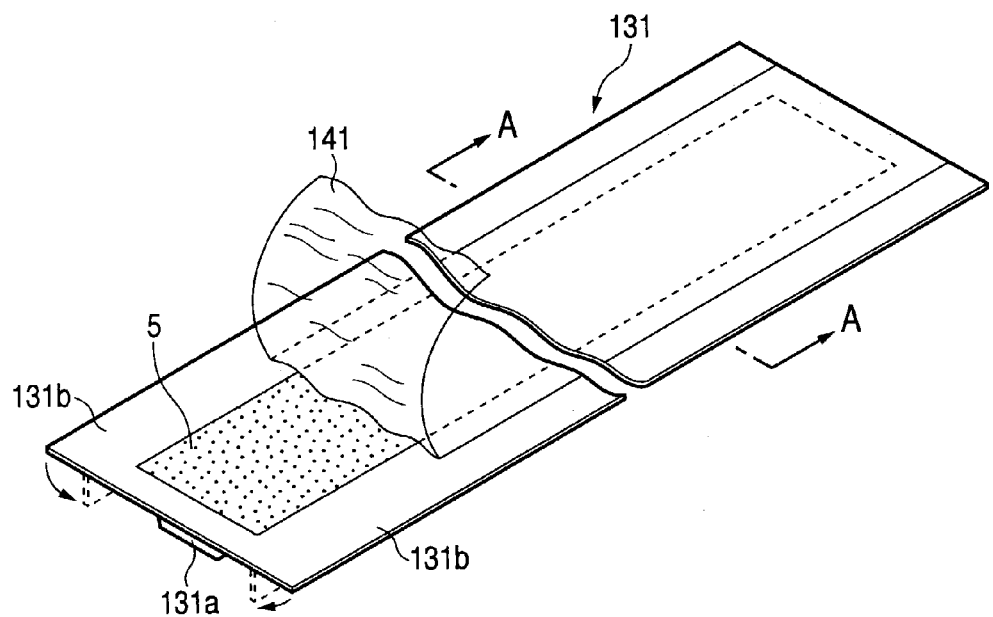
FIG. 13(a) shows the structure of a paste container of a screen printing apparatus according to another embodiment of the invention.
FIG. 13(b) is a cross sectional view of the paste container.
Figure 13:
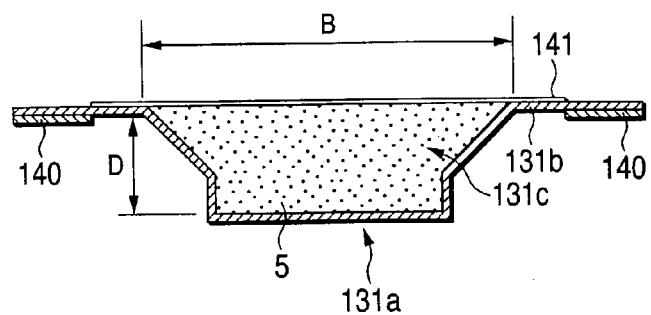

Next, the structure of a cartridge 131 that is a paste container according to another embodiment will be described below with reference to FIGS. 13(a) and 13(b). The cartridge 131 is formed by shaping a flexible film-like material such as a resin film, and is mainly a long and narrow concave portion 131a that conforms to the dimensions and shape of the recess 30a of the main body upper portion 30A as shown in FIG. 13(a). FIG. 13(b) shows a cross-section of the cartridge 131. The concave portion 131a has a flat-bottom shape in which the width B of the opening is greater than the depth D. And the concave portion 131a has such a shape as obtained by connecting a plurality of planes with bending lines formed in between. Its sectional shape will be described below in detail.

A brim 131b projects from the outer periphery of the concave portion 131a in the direction perpendicular to the depth direction of the concave portion 131a (i.e., in the horizontal direction in a mounted state). As described later, the brim 131b serves as holding planes when the cartridge 131 is mounted on the main body upper portion 30A. Adhesive sheets 140 each having an adhesive layer on both surfaces are stuck to the back surface of the brim 131b. The brim 131b is stuck and connected to the main body upper portion 30A with the adhesive sheets 140.

A cover sheet 141 that is a resin thin film is stuck to the entire front surface (i.e., the surface on the side opposite to recess side) of the brim 131b excluding bending margins that are bent when the cartridge 131 is mounted on the main body upper portion 30A. The opening of the concave portion 131a is closed by sticking the cover sheet 141 to the brim 131b, whereby a closed paste containing space 131c is formed between the concave portion 131a and the cover sheet 141. Cream solder 5 is contained in the cartridge 131 in a closed state by injecting cream solder 5 into the paste containing space 131c in a state that the cover sheet 141 is peeled off partially and then sticking the cover sheet 141 to the brim 31b entirely, or injecting cream solder 5 into the paste containing space 131c that is opened and then sticking the cover sheet 141 to the brim 131b entirely.

Figure 14:
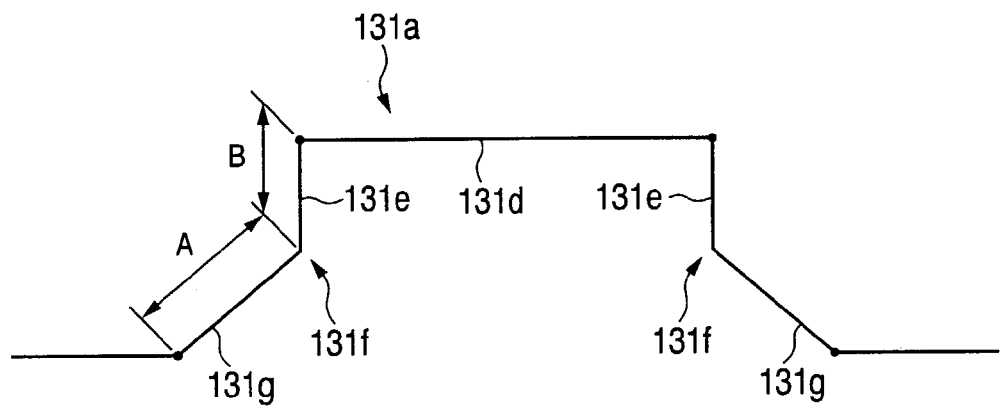
FIG. 14(a), FIG. 14(b) and FIG. 14(c) illustrate a sectional shape of the paste container of a screen printing apparatus according to the embodiment of the invention.
Figure 14:
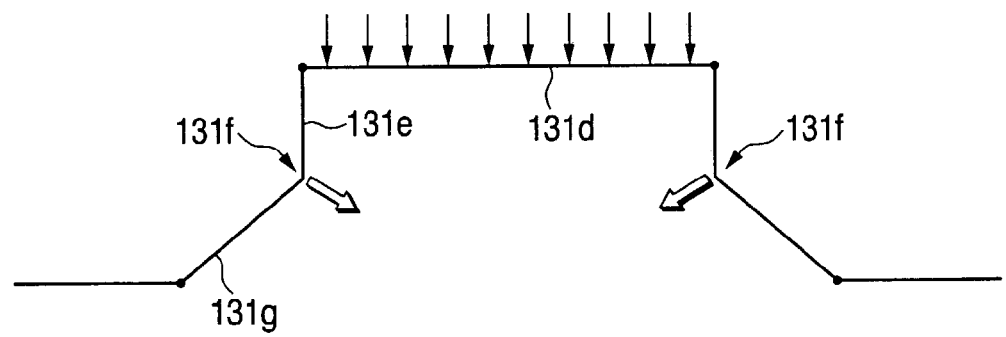
Figure 14:
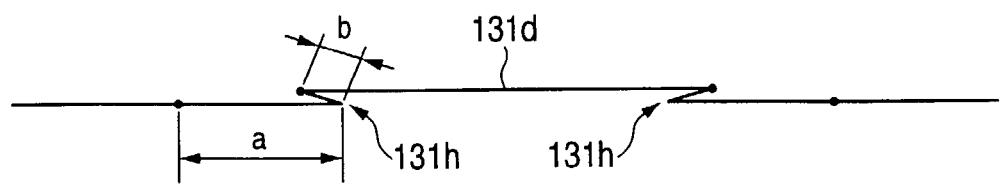

Next, a description will be made of the sectional shape of the concave portion 131a of the cartridge 131 and how the concave portion 131a is deformed when cream solder 5 is pushed out. FIGS. 14(a), 14(b) and 14(c) schematically show sectional shapes of the concave portion 131a by straight lines in a state that the cartridge 131 is mounted in the squeegee head 13 (the opening of the cartridge 131 is located below). As shown in FIG. 14(a), the concave portion 131a has a contact plane 131d with which the pressurizing plate 29 is brought into contact in amounted state, first planes 131e (width: B) that are connected to the two respective side ends of the contact plane 131d and extend downward in the vertical direction, and second planes 131g (width: A) that are connected to the respective first planes 131e and inclined outward. One first plane 131e and one second plane 131g are connected to each other with a horizontal bending line 131f formed in between where the concave portion 131a is bent inward. The same is true of the other first plane 131e and the other second plane 131g. That is, the side planes of the concave portion 131a are creased inward in advance.

FIGS. 14(b) and 14(c) show how the concave portion 131a is deformed when it is crushed. Assume that a uniform weight is exerted on the contact plane 131d from above by means of the pressurizing plate 29 as shown in FIG. 14(b). Since the side planes of the concave portion 131a are creased in advance in the above-described manner, as the contact plane 131d goes down, the first planes 131e and the second planes 131g are deformed in such a manner that the bending lines 131f are displaced inward.

When the contact plane 131d is further pushed down, the first planes 131e and the second planes 131g are folded to such an extent as to be almost included in the same plane as shown in FIG. 14(c). In this state, in general, folding lines 131h do not coincide with the original bending lines 131f and widths a and b shown in FIG. 14(c) satisfy a relationship a+b=A+B. In this manner, forming the bending lines 131f in advance prevents the first planes 131e and the second planes 131g from being deformed so as to expand outward in a crushing process, that is, prevents irregular (i.e., undesirable) deformation. Incidentally, the container sectional shape can be designed so that the folding lines 131h will coincide with the bending lines 131f by setting the bending lines 131f at such positions that relationships A=a and B=b are satisfied.

Figure 15:
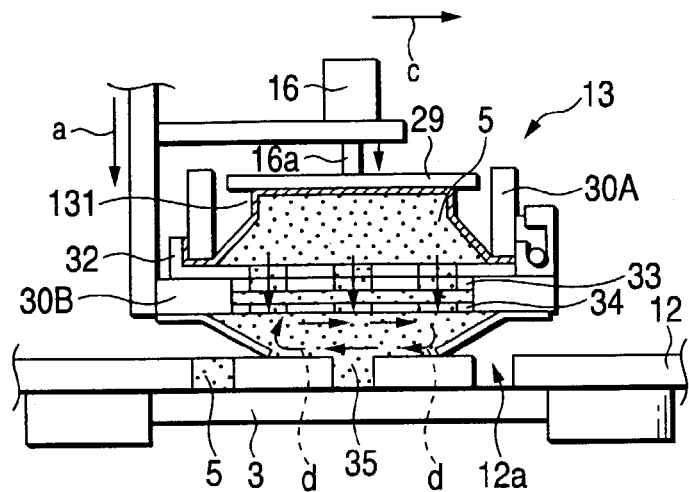
FIG. 15(a), FIG. 15(b) and FIG. 15(c) illustrate the operation of the screen printing apparatus according to the embodiment of the invention.
Figure 15:
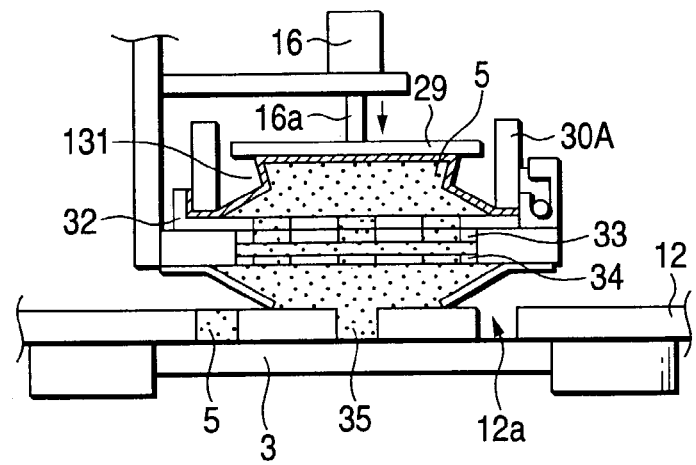
Figure 15:
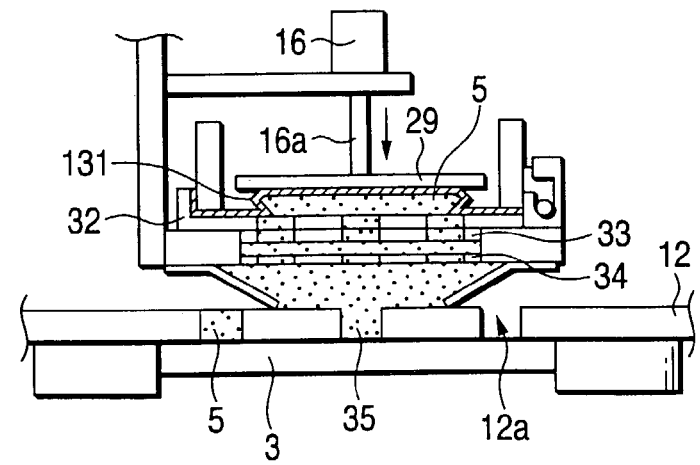

Next, a screen printing operation will be described with reference to FIGS. 15(a), 15(b) and 15(c). To perform screen printing, as shown in FIG. 15(a), in a state that the main body upper portion 30A mounting the cartridge 131 and the stopper plate 32 is combined with the main body lower portion 30B, the squeegee head 13 is lowered toward the mask plate 12 (indicated by arrow a), whereby the sliding contact portions 36A and 36B are brought into contact with the mask plate 12. Then, in the main body upper portion 30A, the cartridge 131 is pressed by the cylinder 16 via the pressurizing plate 29. As a result, cream solder 5 is pushed out from the cartridge. 131 and goes down into the printing space 35 (indicated by arrows b) through the holes 32a, 33a, and 34a (see FIG. 3).

Then, the squeegee head 13 in which the printing space 35 is filled with cream solder 5 is slid on the mask plate 12 (indicated by arrow c). As a result, a rolling flow of the cream solder 5 occurs in the printing space 35 (indicated by arrows d) as the cream solder 5 is raked with one of the sliding contact portions 36A and 36B, and cream solder 5 goes into pattern holes 12a of the mask plate 12 through the opening between the sliding contact portions 36A and 36B. As the squeegee head 13 is moved further, the pattern holes 12a are filled with cream solder 5 in order.

The cream solder 5 inside the printing space 35 and the cartridge 131 is consumed by the above squeegeeing operation performed repeatedly. During that course, the concave portion 131a of the cartridge 131 is deformed being pressed by the pressurizing plate 29 as shown in FIG. 15(b), whereby the cream solder 5 inside the cartridge 131 continues to be pushed out. Finally, as shown in FIG. 15(c), the concave portion 131a is almost crushed (its side walls are folded) and the cartridge 131 is rendered in a solder used-up state. The cartridge 131 will be replaced by a new one.

In the process of pushing out the cream solder 5, when pressed, the concave portion 131a of the cartridge 131 is crushed into the prescribed shape that is assumed in advance, because the concave portion 131a is creased in advance as shown in FIGS. 14(a), 14(b) and 14(c). Therefore, the cartridge 131 is free of a problem that cream solder 5 remains due to irregular crushing of the concave portion 131a into an irregular shape; there does not occur a waste that cream solder 5 that cannot be used any more is discarded together with its waste container.

As described above, the squeegee head 13 according to this embodiment uses the container that is inexpensive and simple in structure rather than a conventional dedicated container that is expensive, and hence can greatly reduce the running cost. Further, the amount of residual solder that is discarded without being used can be reduced to a large extent, whereby screen printing that produces only a small amount of waste of resources can be realized.

In performing screen printing, a preparatory operation is necessary in which paste is stirred to adjust its viscosity. In this embodiment, since the cartridge 131 uses the container that is made of a film-like material that is highly flexible, the cream solder 5 inside the container can easily be stirred externally when necessary. A viscosity adjustment can easily be performed before mounting of the cartridge 131.

The structure of the cartridge 131 as a paste container will be described below with reference to FIGS. 13(a), 13(b), 16(a), 16(b) and 16(c). The cartridge 131 is formed by shaping a flexible film-like material such as a resin film, and is mainly a long and narrow concave portion 131a that conforms to the dimensions and shape of the recess 30a of the main body upper portion 30A as shown in FIG. 13(a). FIG. 13(b) shows a cross-section of the cartridge 131. The concave portion 131a has a flat-bottom shape in which the width B of the opening is greater than the depth D. And the concave portion 131a has such a shape as obtained by connecting a plurality of planes with bending lines formed in between.

A brim 131b projects from the outer periphery of the concave portion 131a in the direction perpendicular to the depth direction of the concave portion 131a (i.e., in the horizontal direction in a mounted state). As described later, the brim 131b serves as holding planes when the cartridge 131 is mounted on the main body upper portion 30A. Adhesive sheets 140 each having an adhesive layer on both surfaces are stuck to the back surface of the brim 131b. The brim 131b is stuck and connected to the main body upper portion 30A with the adhesive sheets 140.

Figure 16:
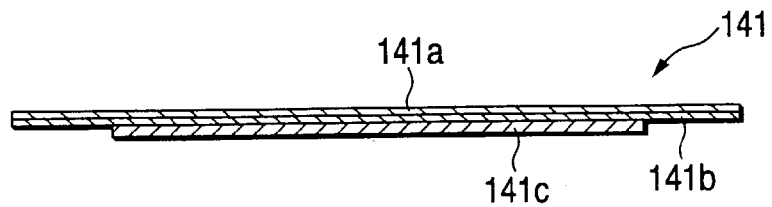
FIG. 16(a), FIG. 16(b) and FIG. 16(c) show the structure of the paste container of a screen printing apparatus according to the second embodiment of the invention.
Figure 16:
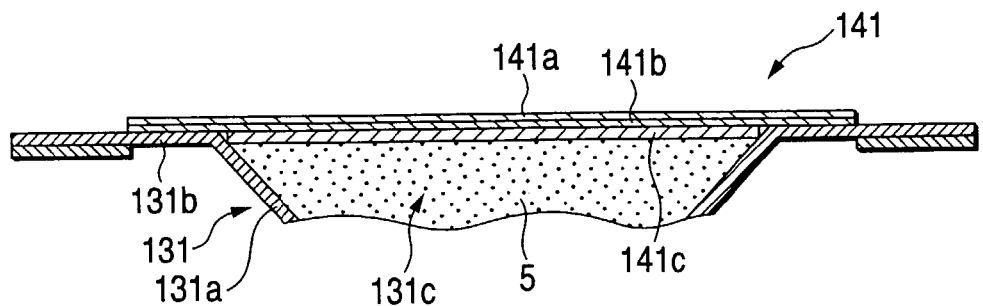
Figure 16:
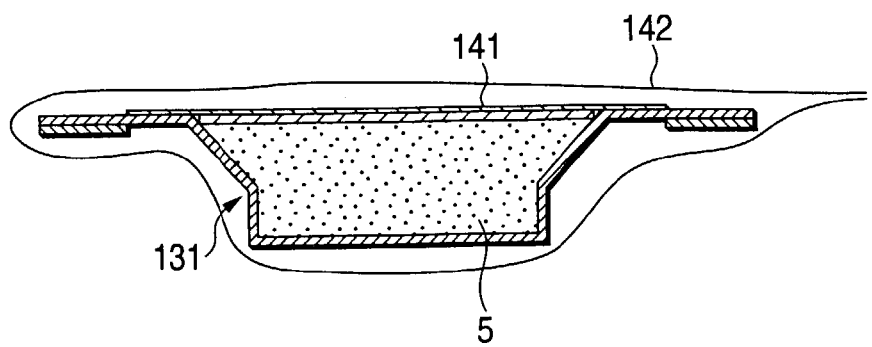

A cover sheet 141 is stuck to the entire front surface (i.e., the surface on the side opposite to recess side) of the brim 131b excluding bending margins that are bent when the cartridge 131 is mounted on the main body upper portion 30A. As shown in FIG. 16(a), the cover sheet 141 has a structure that a sticking layer 141b made of a resin adhesive for sticking to the brim 131b is formed on one surface of a sheet 141a that is a thin film of a resin such as polypropylene. An isolation layer 131c made of the same material as the sheet 141a is stuck in advance to that portion of the surface of the sticking layer 141b which is not stuck to the brim 131b. The opening of the concave portion 131a is closed by sticking the cover sheet 141 to the brim 131b, whereby a closed paste accommodation space 131c is formed between the concave portion 131a and the cover sheet 141.

FIG. 16(b) shows a state that the cover sheet 141 is stuck to the cartridge 131 in which cream solder 5 is accommodated in the paste accommodation space 131c, whereby the cream solder 5 is sealed. In this state, the isolation layer 141c is located so as to cover the opening of the paste accommodation space 131c; that is, the isolation layer 141c is interposed between the cream solder 5 and the sticking layer 141b and isolates the former from the latter. With this measure, while the cartridge 131 in which the cream solder 5 is sealed is stored until it is used, there does not occur a phenomenon that components of the sticking layer 141b are eluted by a solvent component of the cream solder 5 to change the composition of the cream solder 5. The quality of the cream solder 5 does not deteriorate even during storage of a long period.

FIG. 16(c) shows how to handle the cartridge 131 during storage. The cartridge 131 in which the cream solder 5 has been sealed is immediately wrapped in a pouch-shaped sheet 142 having superior airtight to shield the cartridge 131 from the outside air. This suppresses a phenomenon that the solvent component of the cream solder 5 passes through the cover sheet 141 or gaps of the adhered portions to transpire, and hence can minimize its deterioration in quality during storage.

According to the invention, the paste storage portion is configured by the replaceable paste container that is formed by shaping a flexible film-like material into a shape having a bottom opening, and the container holding portion that holds the paste container detachably. This configuration makes it possible to supply paste at a low cost.

Further, according to the invention, in the replaceable paste container to be held detachably in the container holding portion of the paste storage portion, the paste containing space is formed by closing the opening of the long and narrow concave portion made of a flexible film-like material by the film-like cover sheet member on which the sticking layer is formed and the isolation layer intervenes between paste and the sticking layer in a state that the paste is contained in the paste containing space. This configuration realizes a paste container for screen printing that makes it possible to supply paste at a low cost and to prevent elution of a component of the sticking layer into paste and hence deterioration of the composition of the paste.

What is claimed is:

1. A replaceable paste container for screen printing, held detachably in a container holding portion of a paste storage portion of a squeegee head comprising a paste storage portion for storing paste inside, a pressurizing means for moving the paste downward from the paste storage portion by pressurizing the paste by a pressurizing plate, a printing space for containing paste moved from the paste storage portion and for bringing the paste into contact with a top surface of a mask plate via an opening that is formed at the bottom of the printing space, and two sliding contact portions opposed to each other to form front and rear walls in a squeegee direction of the printing space and to slide on the top surface of the mask plate,
   the replaceable paste container comprising:
      a concave portion having long and narrow shape and made of a flexible film-like material;
      a brim portion projecting from an outer periphery of the concave portion to a depth direction of the concave portion, and
      a film-like cover sheet member stuck to the brim portion for covering an opening of the concave portion,
   wherein paste is contained in a space enclosed by the concave portion and the cover sheet member.

2. The paste container for screen printing according to claim 1, wherein the brim portion comprises:
   a connecting means for connecting the paste container to the container holding portion in a state that the paste container is mounted on the container holding portion.

3. The paste container for screen printing according to claim 1, wherein the concave portion comprises:
   a contact surface for contacting to a pressurizing plate of the squeegee head;
   first planes connected to two respective side ends of the contact surface and extending downward;
   second planes connected to the respective first planes through bending lines to bend the concave portion inward.

4. A replaceable paste container for screen printing, held detachably in a container holding portion of a paste storage portion of a squeegee head comprising a paste storage portion for storing paste inside, a pressurizing means for moving the paste downward from the paste storage portion by pressurizing the paste by a pressurizing plate, a printing space for containing paste moved from the paste storage portion and for bringing the paste into contact with a top surface of a mask plate via an opening that is formed at the bottom of the printing space, and two sliding contact portions opposed to each other to form front and rear walls in a squeegee direction of the printing space and to slide on the top surface of the mask plate,
   the replaceable paste container comprising:
      a concave portion having long and narrow shape and made of a flexible film-like material;
      a brim portion projecting from an outer periphery of the concave portion to a depth direction of the concave portion,
      a film-like cover sheet member stuck to the brim portion for covering an opening of the concave portion,
      a sticking layer formed on one side of the cover sheet member for sticking the cover sheet to the brim portion, and
      an isolation layer for isolating paste from the sticking layer by intervening between the paste and the sticking layer,
   wherein paste is contained in a space enclosed by the concave portion and the cover sheet member.

5. A screen printing apparatus for printing paste on a board, using a squeegee head for screen printing comprising a paste storage portion for storing paste inside;
   pressurizing means for moving the paste downward from the paste storage portion by pressurizing the paste;
   a printing space for containing paste moved from the paste storage portion and for bringing the paste into contact with a top surface of a mask plate via an opening formed at the bottom of the printing space, and
   two sliding contact portions opposed to each other, to form front and rear walls in a squeegee direction of the printing space, and to slide on the top surface of the mask plate,
   wherein the screen printing apparatus holds, detachably in a container holding portion of the paste storage portion, a replaceable paste container comprising a concave portion having long and narrow shape and made of a flexible film-like material, a brim portion projecting from an outer periphery of the concave portion to a depth direction of the concave portion, a film-like cover sheet member stuck to the brim portion for covering an opening of the concave portion, and a paste containing space enclosed by the concave portion and the cover sheet member for containing paste inside.

* * * * *

UNITED STATES PATENT AND TRADEMARK OFFICE
CERTIFICATE OF CORRECTION

PATENT NO. : 6,997,107 B2  
APPLICATION NO. : 10/462176  
DATED : February 14, 2006  
INVENTOR(S) : Abe et al.

Page 1 of 1

It is certified that error appears in the above-identified patent and that said Letters Patent is hereby corrected as shown below:

<u>Column 4</u>

Line 9, please delete "damper" and insert therefor - - clamper - -.

Signed and Sealed this

Eighth Day of August, 2006

JON W. DUDAS  
*Director of the United States Patent and Trademark Office*